United States Patent
Rossi et al.

(10) Patent No.: US 8,710,874 B2
(45) Date of Patent: Apr. 29, 2014

(54) TRANSMISSION CHANNEL FOR ULTRASOUND APPLICATIONS

(71) Applicant: STMicroelectronics S.r.l., Agrate Brianza (IT)

(72) Inventors: Sandro Rossi, Pavia (IT); Giulio Ricotti, Broni (IT); Davide Ugo Ghisu, Milan (IT); Antonio Ricciardo, Vigevano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/071,315

(22) Filed: Nov. 4, 2013

(65) Prior Publication Data

US 2014/0055188 A1 Feb. 27, 2014

Related U.S. Application Data

(63) Continuation of application No. 13/538,821, filed on Jun. 29, 2012, which is a continuation-in-part of application No. PCT/EP2010/005931, filed on Sep. 29, 2010, which is a continuation-in-part of application No. PCT/EP2010/005932, filed on Sep. 29, 2010, which is a continuation-in-part of application No. PCT/EP2010/005927, filed on Sep. 29, 2010, which is a continuation-in-part of application No. PCT/EP2010/005930, filed on Sep. 29, 2010.

(30) Foreign Application Priority Data

Dec. 30, 2009 (IT) ............................... MI2009A2338
Dec. 30, 2009 (IT) ............................... MI2009A2339
Dec. 30, 2009 (IT) ............................... MI2009A2340
Dec. 30, 2009 (IT) ............................... MI2009A2341

(51) Int. Cl.
  *H03K 7/06* (2006.01)
(52) U.S. Cl.
  USPC ........... 327/108; 327/109; 327/110; 327/111; 327/112; 327/170
(58) Field of Classification Search
  CPC ................. H03K 19/00361; H04L 25/028
  USPC .................. 327/108–112, 170, 379, 389–391
  See application file for complete search history.

(56) References Cited

U.S. PATENT DOCUMENTS

| 3,958,127 A | 5/1976 | Faulhaber et al. |
| 5,414,378 A * | 5/1995 | Edgar et al. .................. 327/143 |
| 5,475,342 A * | 12/1995 | Nakamura et al. ............. 330/136 |
| 6,050,945 A | 4/2000 | Peterson et al. |
| 6,269,052 B1 | 7/2001 | Oppelt |

(Continued)

FOREIGN PATENT DOCUMENTS

WO 2005/078931 A1 8/2005

*Primary Examiner* — Adam Houston
(74) *Attorney, Agent, or Firm* — Seed IP Law Group PLLC

(57) ABSTRACT

A transmission channel configured to transmit high-voltage pulses and to receive echos of the high-voltage pulses includes a high voltage buffer, a voltage clamp and a switch. The voltage clamp may include clamping transistors and switching off transistors coupled together in series with body diodes in anti-series. The transmission channel may include a reset circuit configured to bias the transmission channel between pulses. The switch may include a bootstrap circuit.

18 Claims, 7 Drawing Sheets

(56) References Cited

U.S. PATENT DOCUMENTS

| | | |
|---|---|---|
| 6,540,677 B1 | 4/2003 | Angelsen et al. |
| 7,324,167 B2 | 1/2008 | Miller |
| 7,432,737 B2 * | 10/2008 | Yoshida .......................... 326/46 |
| 7,760,272 B2 | 7/2010 | Miller |
| 7,888,985 B2 * | 2/2011 | Osaka .......................... 327/333 |
| 8,159,267 B2 * | 4/2012 | Yoshida .......................... 326/46 |
| 2002/0070805 A1 | 6/2002 | Ausserlechner et al. |
| 2004/0227556 A1 * | 11/2004 | Ohmori .......................... 327/309 |
| 2005/0139931 A1 | 6/2005 | Arai |
| 2008/0116751 A1 | 5/2008 | Kihara et al. |
| 2009/0206676 A1 | 8/2009 | Chu et al. |
| 2010/0067915 A1 | 3/2010 | Fukasaku et al. |
| 2011/0115540 A1 * | 5/2011 | Kamp .......................... 327/321 |
| 2012/0268092 A1 * | 10/2012 | Rossi et al. .................... 323/282 |
| 2012/0268186 A1 * | 10/2012 | Rossi et al. .................... 327/309 |
| 2012/0268189 A1 * | 10/2012 | Rossi et al. .................... 327/333 |
| 2012/0268200 A1 * | 10/2012 | Rossi et al. .................... 327/574 |

* cited by examiner

TRANSMISSION CHANNEL FOR ULTRASOUND APPLICATIONS

BACKGROUND

1. Technical Field

The present disclosure relates to transmission channels. The disclosure relates, but not exclusively, to transmission channels for ultrasound applications and the following description is made with reference to this field of application by way of illustration only.

2. Description of the Related Art

Sonography or ultrasonography is a system of medical diagnostic testing that uses ultrasonic waves or ultrasounds and is based on the principle of the transmission of the ultrasounds and of the emission of echo and is widely used in the internistic, surgical and radiological field.

The ultrasounds normally used are, for example, between 2 and 20 MHz in frequency. The frequency is chosen by taking into consideration that higher frequencies have a greater image resolving power, but penetrate less in depth in the subject under examination.

These ultrasounds are being normally generated by a piezoceramic crystal inserted in a probe maintained in direct contact with the skin of the subject with the interposition of a suitable gel (being suitable for eliminating the air between probe and subject's skin, allowing the ultrasounds to penetrate in the anatomic segment under examination). The same probe is able to collect a return signal or echo, which may be suitably processed by a computer and displayed on a monitor.

The ultrasounds that reach a variation point of the acoustic impedance, and thus for example an internal organ, are partially reflected and the reflected percentage conveys information about the impedance difference between the crossed tissues. It is to be noted that, the big impedance difference between a bone and a tissue being considered, with the sonography it is generally not possible to see behind a bone, which causes a total reflection of the ultrasounds, while air or gas zones give "shade", causing a partial reflection of the ultrasounds.

The time employed by an ultrasonic wave for carrying out the path of going, reflection and return is provided to the computer, which calculates the depth wherefrom the echo has come, thus identifying the division surface between the crossed tissues (corresponding to the variation point of the acoustic impedance and thus to the depth wherefrom the echo comes).

Substantially, an ultrasonographer, in particular a diagnostic apparatus based on the ultrasound sonography, may essentially comprise three parts:

- a probe comprising at least one transducer, for example of the ultrasonic type, which transmits and receives an ultrasound signal;
- an electronic system that drives the transducer for the generation of the ultrasound signal or pulse to be transmitted and receives an echo signal of return at the probe of this pulse, processing in consequence the received echo signal; and
- a displaying system of a corresponding sonography image processed based on the echo signal received by the probe.

The word transducer generally indicates an electric or electronic device that converts a type of energy relative to mechanical and physical quantities into electric signals. In a broad sense, a transducer is sometimes defined as any device that converts energy from one form to another, so that this latter can be re-processed, for example by men or by other machines. Many transducers are both sensors and actuators. An ultrasonic transducer usually comprises a piezoelectric crystal that is suitably biased for causing its deformation and the generation of the ultrasound signal or pulse.

A typical transmission channel or TX channel being used in these applications is schematically shown in FIG. 1.

The transmission channel 1 comprises an input logic 2 that drives, in correspondence with an input bus $BUS_{IN}$, a level shifter 3, in turn connected to a high voltage buffer block 4. The high voltage buffer block 4 is electrically coupled between pairs of high voltage reference terminals, respectively higher voltage reference terminals HVP0 and HVP1 and lower voltage reference terminals HVM0 and HVM1, and has a pair of input terminals, INB1 and INB2, connected to the level shifter 3, as well as a pair of output terminals, OUTB1 and OUTB2, connected to a corresponding pair of input terminals, INC1 and INC2 of a clamping block 5.

Furthermore, the clamping block 5 is connected to a clamp voltage reference terminal PGND and has an output terminal corresponding to a first output terminal HVout of the transmission channel 1, in turn connected, through an anti-noise block 6, to a connection terminal Xdcr for the transducer to be driven through the transmission channel 1.

A high voltage switch 7 is electrically coupled between the connection terminal Xdcr and a second output terminal LVout of the transmission channel 1. This high voltage switch 7 is able to transmit an output signal being at the output of the anti-noise block 6 to the second output terminal LVout during the receiving step of the transmission channel 1.

It is to be noted that the switch 7 may be a high voltage one since, during the transmission step of the transmission channel 1, a signal being on the connection terminal Xdcr is a high voltage signal although the switch 7 is off. When this switch 7 is instead on, i.e., during the reception step of the transmission channel 1, the signal Xdcr is generally at a voltage value next to zero since the piezoelectric transducer connected to the transmission channel 1 is sensing small return echoes of ultrasound pulse signals, as shown in FIG. 2.

Typically, an ultrasonic transducer transmits a high voltage pulse of the duration of a few us, and listens for reception of the echo of this pulse, generated by the reflection on the organs of a subject under examination, for the duration of about 250 us, to go back to the transmission of a new high voltage pulse.

For example, a first pulse IM1 and a second pulse IM2 are transmitted with a peak to peak excursion equal, in the example shown, to 190 Vpp with reception by the transducer of corresponding echoes shown in FIG. 2 and indicated with E1 and E2.

The high voltage switch 7 is shown in greater detail in FIG. 3A, while its equivalent circuit according to working conditions (ON) is shown in FIG. 3B.

The high voltage switch 7 comprises a first switching transistor MS1 and a second switching transistor MS2, being electrically coupled, in series to each other, between the connection terminal Xdcr and the second output terminal LVout of the transmission channel 1 and having respective control or gate terminals connected, at the turning-on of the switch 7 itself, to a first and to a second supply voltage reference terminals, VDD_M and VDD_P respectively. FIG. 3A also shows the equivalent diodes, DS1 and DS2, of the switching transistors, MS1 and MS2, as well as their gate-source capacitances, Cg1 and Cg2 respectively.

The first capacitance Cg1 of the first switching transistor MS1 is connected between the corresponding gate terminal, in turn connected to the first supply voltage reference terminal VDD_M and a first switching node XS1, corresponding to a source terminal of the first switching transistor MS1. Similarly, the second capacitance Cg2 of the second switching transistor MS2 is connected between the relative gate terminal, in turn connected to the second supply voltage reference terminal VDD_P and a second switching node XS2, corresponding to a source terminal of the second switching transistor MS2.

As shown in the equivalent circuit of FIG. 3B, when the high voltage switch 7 is on and thus the gate terminals of the switching transistors MS1 and MS2 are connected to the first VDD_M and to the second supply voltage reference terminal VDD_P as indicated in FIG. 3A (which in FIG. 3B, for sake of simplicity, have been shown as a single reference voltage, for example, ground, being these first and second supply voltage references), these switching transistors behave as respective resistances R1 and R2, that are electrically coupled between the connection terminal Xdcr and the second output terminal LVout of the transmission channel 1 (the second output terminal LVout coinciding with the second switching node XS2) and interconnected in correspondence with the first switching node XS1.

According to these conditions, the first capacitance Cg1 is connected between the first connection node XS1 and the first supply voltage reference VDD_M, while the second capacitance Cg2 is connected between the second connection node XS2 and the second supply voltage reference VDD_P. The first and second supply voltage references are fixed supplies, and are shown for sake of simplicity in FIG. 3B as a single reference voltage, the ground GND. This parallel capacitance introduces a strong mitigation of the signal at the input of the high voltage switch 7, i.e., of the signal at the output of the transmission channel 1 after the anti-noise block 6.

In general, then, the switch 7 should be a high voltage one so as not to break itself during the transmission step but it is in practice on always with low voltages during the receiving step.

Further, the high voltage buffer block 4 comprises a first branch comprising a first buffer transistor MB1 and a first buffer diode DB1, being electrically coupled, in series to each other, between a first higher voltage reference terminal HVP0 and a buffer central node XBc, as well as a second buffer diode DB2 and a second buffer transistor MB2, electrically coupled, in series to each other, between the buffer central node XBc and a first lower voltage reference terminal HVM0. The first and second buffer transistors, MB1 and MB2, have respective control or gate terminals in correspondence with a first XB1 and with a second inner circuit node XB2 of the high voltage buffer block 4 and connected to, and driven by, a first DRB1 and a second buffer input driver DRB2, in turn connected to the level shifter 3 in correspondence with the first and second input terminals, INB1 and INB2, of the high voltage buffer block 4.

The high voltage buffer block 4 also comprises, in parallel to the first branch, a second branch in turn comprising a third buffer transistor MB3 and a third buffer diode DB3, being electrically coupled, in series to each other, between a second higher voltage reference terminal HVP1 and the buffer central node XBc, as well as a fourth buffer diode DB4 and a fourth buffer transistor MB4, electrically coupled, in series to each other, between the buffer central node XBc and a second lower voltage reference terminal HVM1. The third and fourth buffer transistors, MB3 and MB4, have respective control or gate terminals in correspondence with a third XB3 and a fourth inner circuit node XB4 of the high voltage buffer block 4 and connected to, and driven by, a third DRB3 and a fourth buffer input driver DRB4, in turn connected to the first XB1 and to the second inner circuit node XB2 and then to the first DRB1 and to the second buffer input driver DRB2, respectively, as well as to a first OUTB1 and to a second output terminal OUTB2.

In the example of the figure, the first and third buffer transistors, MB1 and MB3, are high voltage P-channel MOS transistors (HV Pmos) while the second and fourth buffer transistors, MB2 and MB4, are high voltage N-channel MOS transistors (HV Nmos). Moreover, the buffer diodes, DB1, DB2, DB3 and DB4, are high voltage diodes (HV diode).

The clamping block 5 has in turn a first INC1 and a second input terminal INC2, respectively connected to the first OUTB1 and second output terminal OUTB2 of the high voltage buffer block 4.

The clamping block 5 comprises a first clamp driver DRC1 connected between the first input terminal INC1 and a control or gate terminal of a first clamp transistor MC1, in turn electrically coupled, in series with a first clamp diode DC1, between the clamp voltage reference terminal PGND, for example a ground, and a clamp central node XCc. The first clamp transistor MC1 and the first clamp diode DC1 are interconnected in correspondence with a first clamp circuit node XC1.

The clamping block 5 also comprises a second clamp driver DRC2 connected between the second input terminal INC2 and a control or gate terminal of a second clamp transistor MC2, in turn electrically coupled, in series with a second clamp diode DC2, between the clamp central node XCc and the clamp voltage reference terminal PGND. The second clamp transistor MC2 and the second clamp diode DC2 are interconnected in correspondence with a second clamp circuit node XC2.

The clamp central node XCc is also connected to the first output terminal HVout of the transmission channel 1, in turn connected to the connection terminal Xdcr through an anti-noise block 6 comprising respective first and second anti-noise diodes, DN1 and DN2, connected in antiparallel, i.e., by having the anode terminal of the first diode connected to the cathode terminal of the second diode and vice versa, between the first output terminal HVout and the connection terminal Xdcr.

In the example of the figure, the first clamp transistor MC1 is a high voltage P-channel MOS transistor (HV Pmos) while the second clamp transistor MC2 is a high voltage N-channel MOS transistor (HV Nmos). Moreover, the clamp diodes, DC1 and DC2, are high voltage diodes (HV diode) while the anti-noise diodes, DN1 and DN2, are low voltage diodes (LV diode).

The clamping block 5 is also shown in FIG. 4, in the case of a clamping operation to a ground voltage reference GND, i.e., during the receiving step of the transmission channel 1. It is to be noted that the clamping to the ground voltage reference GND generally should be ensured also when the load is mainly capacitive. In this case, the output terminal of the transmission channel should generally be brought back to this ground value after the transmission.

Furthermore, the clamping to the ground is generally desirable in applications in which the high voltage wave form to be transmitted, besides oscillating between a positive value of high voltage and a negative value of high voltage, stays for determined periods of time at the ground value.

Also the anti-noise block 6 is indicated too, being connected between the first output terminal HVout and the connection terminal Xdcr of the transmission channel 1.

This FIG. 4 also shows the equivalent diodes, DMC1 and DMC2, of the clamp transistors, MC1 and MC2, respectively, the first and second clamp input drivers, DRC1 and DRC2, being connected between a first clamp supply voltage reference terminal and a second clamp supply voltage reference terminal, higher VDD_P and lower VDD_M, respectively, and the ground GND, whereto also the clamp central node XCc is connected.

BRIEF SUMMARY

It is evident from the scheme of FIG. 4, that, when the clamping block 5 is on, the first output terminal HVout is at a voltage value, corresponding to the value of ground voltage GND plus or minus a diode voltage and the connection terminal Xdcr to a value of ground voltage GND plus or minus two diode voltages.

In theory, the optimal working condition would have this first output terminal HVout at a value equal to the ground GND, condition in which the distortions of the transmitted signal by the transmission channel 1 are minimum. In fact, the real working conditions of the clamping block 5 above illustrated show worsening in the performances of second harmonic, especially under conditions of low supply voltages.

In case of connection of a load of great value, a high current can circulate through the high voltage clamp diodes DC1 and DC2, charging the junction intrinsic capacitances of the same diodes and causing a malfunction.

During the reception step of the transmission channel 1, it is generally necessary to wait that the connection terminal Xdcr is at zero. Leakage current of the first output terminal HVout, caused by the noise introduced by the charges being in the clamp diodes DC1 and DC2, causes a raising of the voltage value also on this connection terminal Xdcr and thus a receiving disturbance.

For example, once the high voltage buffer block 4 has been turned on again, the first output terminal HVout does not immediately respond since most of the current supplied by this high voltage buffer block 4 is used for the discharge of the junction capacitances of the clamp diodes DC1 and DC2, precharged during the clamping step. This malfunction is particularly felt in case of short pulses.

Moreover, during the reception step in which the clamping block 5 is on and the connection terminal Xdcr has a voltage value next to but not equal to the ground GND, a leakage current could charge the first output terminal HVout at a voltage higher than the threshold voltage of the anti-noise diodes, DN1 and DN2, of the anti-noise block 6 and, in consequence, disturb a reception on the connection terminal Xdcr.

After a cycle of pulses, the anode terminals of the first DB1 and of the third buffer diode DB3 and the cathode terminals of the second DB2 and of the fourth buffer diode DB4 stabilise at a voltage depending on different factors such as the value of a supply voltage, the value of the inner capacitances, which one and how many transistors are used for the switching, the switching frequency etc.

This means that each successive pulse train may find a different and non defined initial condition.

By changing the initial status also the output wave form is modified with the consequence that, the input control being identical, it is possible to obtain different outputs. In other words, the wave form of the output signal is function of the input signals and of the initial condition resulting from the switches previously occurred thus creating a sort of "memory effect".

An embodiment facilitates providing desirable and predictable switching initial conditions in a transmission channel clamping circuit.

In an embodiment, high voltage diodes are connected to the inner nodes of the high voltage buffer block of the transmission channel to bias its condition between a pulse cycle and another one so as to reduce the memory effect of this buffer block, as well as of associating the clamp transistors to corresponding high voltage MOS transistors able to close themselves when the clamping circuit is active and likewise able to sustain positive and negative high voltages when instead the clamping circuit is not active and the transistors are in open configuration and of realising a switching circuit of the type comprising switching transistors and provided with bootstrap circuitry configured to drive the control terminals of these switching transistors with a following of a signal at the input of the switching circuit itself towards its output.

In an embodiment, a transmission channel comprises:
 a high voltage buffer block comprising buffer transistors and respective buffer diodes, being electrically coupled between respective voltage reference terminals, said high voltage buffer block having at least one first and one second output terminal, as well as a buffer central node;
 a clamping circuit being connected to a first output terminal of said transmission channel and having at least one first and one second input terminal connected to said first and second output terminals of said high voltage buffer block, a first and a second clamp circuit node, as well as a clamp central node connected to said buffer central node;
 an anti-noise block being connected between said first output terminal and a connection terminal of said transmission channel; as well as
 a switching circuit being electrically coupled between said connection terminal and a second output terminal of said transmission channel
 characterised in that
 said clamping circuit comprises a clamping core in turn including at least one first and one second clamp transistor, connected to said central node and to said first and second clamp circuit node, respectively, through diodes connected to prevent the body diodes of said clamping transistors from conducting and having respective control terminals, as well as at least one first switching off transistor connected to said output terminal and to said first clamp transistor and a second switching off transistor connected to said output terminal and to said clamp transistor, said first and second clamp transistors being high voltage MOS transistors of complementary type and said first and second switching off transistors being high voltage MOS transistors of complementary type connected to said first and second clamp transistors by having the respective equivalent or body diodes in anti-series so as to close themselves when said clamping circuit is active and to sustain positive and negative high voltages when said clamping circuit is not active;
 said reset circuit comprising diodes and being electrically coupled between circuit nodes of said high voltage buffer block and of said clamping circuit, said circuit nodes being in correspondence with conduction terminals of said transistors comprised into said high voltage buffer block and into said clamping circuit, and
 said switching circuit comprising at least one first and one second switching transistor which are high voltage MOS transistors of complementary type being electrically coupled, in series to each other and by having respective equivalent or body diodes in anti-series, between said connection terminal and said second output terminal, as well as at least one bootstrap circuit connected to respective first and second control terminals of said at least one first and one second switching transistor, as well as to respective first and second voltage reference terminals and having values of parasite capacitances between said first and second control terminals and at least one first and one second bootstrap node of at least one order of magnitude lower with respect to the gate-source capacitances of said at least one first and one second switching transistor.

Embodiments may comprise, for example, the following supplementary and optional characteristics, taken alone or in combination.

In an embodiment, said first switching off transistor may be a high voltage P-channel MOS transistor and said second switching off transistor may be a high voltage N-channel MOS transistor.

In an embodiment, said transmission channel may further comprise a driving circuit connected to respective control terminals of said first and second clamp transistors and of said first and second switching off transistors and suitable for closing said first and second switching off transistors when said clamping circuit is active.

In an embodiment, said driving circuit may comprise a first and a second driving transistor, being electrically coupled, in a crossed way, between said control terminals of said first and second clamp transistors, and respective control terminals of said first and second switching off transistors.

In an embodiment, said first driving transistor may be electrically coupled between said control terminal of said first clamp transistor and a control terminal of said second switching off transistor and said second driving transistor may be electrically coupled between a control terminal of said first switching off transistor and said control terminal of said second clamp transistor.

In an embodiment, said first and second driving transistors may have respective control terminals connected to said clamp central node.

In an embodiment, said clamping core may be connected at the input to an input driver block comprising a first and a second driver electrically coupled between a first supply voltage reference terminal and a second supply voltage reference terminal and having respective output terminals connected to said control terminals of said first and second clamp transistors.

In an embodiment, said first clamp transistor may be a high voltage N-channel MOS transistor and said second clamp transistor may be a high voltage P-channel MOS transistor.

In an embodiment, said first and second driving transistors may be high voltage MOS transistors of a type similar to said first and second switching off transistors.

In an embodiment, said first switching off transistor may be a high voltage N-channel MOS transistor and said second switching off transistor may be a high voltage P-channel MOS transistor.

In an embodiment, said high voltage buffer block comprises at least one first branch in turn including a first buffer transistor and a first buffer diode, being electrically coupled, in series to each other, between a first higher voltage reference terminal and a buffer central node and interconnected in correspondence with a first memory node, as well as a second buffer diode and a second buffer transistor, being electrically coupled, in series to each other, between said buffer central node and a first lower voltage reference terminal and interconnected in correspondence with a second memory node, and said reset circuit may comprise:
- a first memory diode, being electrically coupled between said first memory node and said first clamp circuit node; and
- a second memory diode, being electrically coupled between said second memory node and said second clamp circuit node.

In an embodiment, said first memory diode may have a cathode terminal connected to said first memory node and an anode terminal connected to said first clamp circuit node and said second memory diode may have an anode terminal connected to said second memory node and a cathode terminal connected to said second clamp circuit node.

In an embodiment, said first memory node may be connected to an anode terminal of said first buffer diode and said first clamp circuit node may be connected to an anode terminal of said first clamp diode and said second memory node may be connected to a cathode terminal of said second buffer diode and said second clamp circuit node may be connected to a cathode terminal of said second clamp diode.

In an embodiment, said first memory node may be in correspondence with a drain terminal of said first buffer transistor and said second memory node may be in correspondence with a drain terminal of said second buffer transistor.

Moreover, in an embodiment, said high voltage buffer block also comprises, in parallel to said first branch, a second branch in turn including a third buffer transistor and a third buffer diode, being electrically coupled, in series to each other, between a second higher voltage reference terminal and said buffer central node and interconnected in correspondence with a third memory node, as well as a fourth buffer diode and a fourth buffer transistor, being electrically coupled, in series to each other, between said buffer central node and a second lower voltage reference terminal and interconnected in correspondence with a fourth memory node, and said reset circuit may further comprise:
- a third memory diode, being electrically coupled between said third memory node and said first clamp circuit node; and
- a fourth memory diode, being electrically coupled between said fourth memory node and said second clamp circuit node.

In an embodiment, said third memory diode may have a cathode terminal connected to said third memory node and an anode terminal connected to said first clamp circuit node and said fourth memory diode may have an anode terminal connected to said fourth memory node and a cathode terminal connected to said second clamp circuit node.

In an embodiment, said third memory node may be connected to an anode terminal of said third buffer diode and said first clamp circuit node may be connected to an anode terminal of said first clamp diode and said fourth memory node may be connected to a cathode terminal of said fourth buffer diode and said second clamp circuit node may be connected to a cathode terminal of said second clamp diode.

In an embodiment, said third memory node may be in correspondence with a drain terminal of said third buffer transistor and said fourth memory node may be in correspondence with a drain terminal of said fourth buffer transistor.

In an embodiment, said high voltage buffer block may comprise respective buffer drivers connected to control terminals of said buffer transistors.

In an embodiment, said bootstrap circuit of said switching circuit may comprise at least one first biasing generator electrically coupled between said first control terminal and said first bootstrap node, as well as a second biasing generator electrically coupled between said second bootstrap node and said second control terminal as first and second parasite capacitances of said bootstrap circuit.

In an embodiment, said at least one first and second biasing generator may supply respective first and second biasing current.

In an embodiment, said bootstrap circuit further comprises a first bootstrap transistor being electrically coupled, in series to a first bootstrap resistive element, between said first control terminal of said first switching transistor and said second bootstrap node, as well as a second bootstrap transistor being electrically coupled, in series to a second bootstrap resistive element, between said second control terminal of said second switching transistor and said first bootstrap node.

In an embodiment, said first bootstrap transistor may have a control terminal connected to a first inner circuit node of said switching circuit, corresponding to a source terminal of said first switching transistor and said second bootstrap transistor may have a control terminal connected to a second inner circuit node of said switching circuit, corresponding to a source terminal of said second switching transistor.

In an embodiment, said first bootstrap transistor may be a low voltage N-channel MOS transistor and said second bootstrap transistor may be a low voltage P-channel MOS transistor.

In an embodiment, said first and second bootstrap nodes may be connected to said first and second voltage references, respectively.

In an embodiment, said values of parasite capacitances of said bootstrap circuit may be of at least some orders of magnitude, preferably three, lower with respect to the gate-source capacitances of said at least one first and one second switching transistor.

In an embodiment, a transmission channel comprises: a clamp including: a clamp output; a clamp input configured to couple to a reference voltage; a first clamping transistor; a second clamping transistor; a first switching off transistor coupled between the output and the first clamping transistor; and a second switching off transistor of the clamp coupled between the output and the second clamping transistor, wherein, the first and second clamping transistors are high-voltage MOS transistors of complementary types; the first clamping transistor is coupled between the first switching off transistor and the input, the first clamping transistor and the first switching off transistor having body diodes coupled together in anti-series; and the second clamping transistor is coupled between the second switching off transistor and the input, the second clamping transistor and the second switching off transistor having body diodes coupled together in anti-series; and a reset block including: a first memory diode coupled to a conduction terminal of the first clamp transistor and configured to couple to a conduction terminal of a first transistor of a high-voltage buffer; and a second memory diode coupled to a conduction terminal of the second clamp transistor and configured to couple to a conduction terminal of a second transistor of the high-voltage buffer. In an embodiment, the transmission channel further comprises: a switching circuit, having: a connection terminal; an output terminal; first and second voltage reference terminals; first and second switching transistors electrically coupled in series to each other, and having respective body diodes coupled in anti-series, between said connection terminal and said output terminal, the first switching transistor having a first control terminal and the second switching transistor having a second control terminal; and a bootstrap circuit connected to the first and second control terminals and to the first and second voltage references and including: first and second bootstrap nodes; a first parasitic capacitance electrically coupled between said first control terminal and the first bootstrap node; and a second parasitic capacitance electrically coupled between said second control terminal and the second bootstrap node, the first and second parasitic capacitances having capacitance values of at least one order of magnitude lower than gate-source capacitances of said first and second switching transistors. In an embodiment, the transmission channel further comprises: the high-voltage buffer; and an anti-noise block coupled between the clamp and the switching circuit. In an embodiment, said first switching off transistor is a high voltage P-channel MOS transistor and said second switching off transistor is a high voltage N-channel MOS transistor. In an embodiment, the transmission channel further comprises a driving circuit coupled to control terminals of said first and second clamp transistors and of said first and second switching off transistors and configured to generate driving signals to close said first and second switching off transistors when said clamping circuit is active. In an embodiment, said driving circuit comprises: a first driving transistor coupled between the control terminal of the first clamping transistor and the control terminal of the second switching off transistor; and a second driving transistor coupled between the control terminal of the second clamping transistor and the control terminal of the first switching off transistor. In an embodiment, said first and second driving transistors have respective control terminals connected to said clamp input. In an embodiment, the clamp comprises an input driver block, the control terminal of the first clamping transistor is coupled to an output of a first driver of the input driver block and the control terminal of the second clamping transistor is coupled to an output of a second driver of the input driver block. In an embodiment, said first clamping transistor is a high voltage N-channel MOS transistor and said second clamping transistor is a high voltage P-channel MOS transistor. In an embodiment, said first driving transistor and the first switching off transistor are of a first MOS type and the second driving transistor and the second switching-off transistor are of a second MOS type complementary to the first MOS type. In an embodiment, the transmission channel further comprises the high-voltage buffer, wherein the high voltage buffer includes at least one first branch having the first buffer transistor and a first buffer diode coupled in series between a first higher voltage reference terminal and a buffer central node, and a second buffer diode and the second buffer transistor coupled in series between said buffer central node and a first lower voltage reference terminal. In an embodiment, said first memory diode has a cathode coupled to said conduction terminal of the first buffer transistor and an anode coupled to said conduction terminal of the first clamp transistor, said second memory diode has an anode coupled to said conduction terminal of the second buffer transistor and a cathode coupled to said conduction terminal of the second clamp transistor, said first buffer diode has an anode coupled to the cathode of the first memory diode, said second buffer diode has a cathode coupled to the anode of the first memory diode, the conduction terminal of the first buffer transistor is a drain terminal of the first buffer transistor and the conduction terminal of the second buffer transistor is a drain terminal of the second buffer transistor. In an embodiment, said high voltage buffer block includes a second branch including a third buffer transistor and a third buffer diode coupled in series between a second higher voltage reference terminal and said buffer central node, and a fourth buffer diode and a fourth buffer transistor coupled in series between said buffer central node and a second lower voltage reference terminal, and said reset block comprises: a third memory diode coupled between a conduction terminal of the third buffer transistor and the conduction terminal of the first clamp transistor; and a fourth memory diode coupled between a conduction terminal of the fourth buffer transistor and the conduction terminal of the second clamp transistor, wherein said third memory diode has a cathode coupled to said conduction terminal of the third buffer transistor and an anode coupled to said conduction terminal of the first clamp transistor, said fourth memory diode has an anode coupled to the conduction terminal of said fourth buffer transistor and a cathode coupled to said conduction terminal of the second clamp transistor, the conduction terminal of the third buffer transistor is a drain terminal of the third buffer transistor and the conduction terminal of the fourth buffer transistor is a drain terminal of the fourth buffer transistor. In an embodiment, said high voltage buffer block comprises respective buffer drivers connected to control terminals of said buffer transistors. In an embodiment, said bootstrap circuit comprises: a first biasing generator electrically coupled between said first control terminal of the first switching transistor and said first bootstrap node; and a second biasing generator electrically coupled between second bootstrap node and said second control terminal of the second switching transistor, the first and second biasing generators including the first and second parasitic capacitances, respectively. In an embodiment, said bootstrap circuit further comprises: a first bootstrap transistor and a first bootstrap resistive element electrically coupled in series to each other between said first control terminal of the first switching transistor and said second bootstrap node; and a second bootstrap transistor and a second bootstrap resistive element electrically coupled in series to each other between said second control terminal of the second switching transistor and said first bootstrap node, said first bootstrap transistor has a control terminal electrically coupled to a source terminal of said first switching transistor and said second bootstrap transistor has a control terminal electrically coupled to a source terminal of said second switching transistor. In an embodiment, said values of said parasitic capacitances of said bootstrap circuit are of at least three orders of magnitude lower with respect to the gate-source capacitances of said first and second switching transistors.

In an embodiment, a transmission channel comprises: a clamp including: a clamp output; a clamp input configured to couple to a reference voltage; a first clamping transistor; a second clamping transistor; a first switching off transistor coupled between the output and the first clamping transistor; and a second switching off transistor of the clamp coupled between the output and the second clamping transistor, wherein, the first and second clamping transistors are high-voltage MOS transistors of complementary types; the first clamping transistor is coupled between the first switching off transistor and the input, the first clamping transistor and the first switching off transistor having body diodes coupled together in anti-series; and the second clamping transistor is coupled between the second switching off transistor and the input, the second clamping transistor and the second switching off transistor having body diodes coupled together in anti-series; and a switching circuit, including: a connection terminal; an output terminal; first and second voltage reference terminals; first and second switching transistors electrically coupled in series to each other, and having respective body diodes coupled in anti-series, between said connection terminal and said output terminal, the first switching transistor having a first control terminal and the second switching transistor having a second control terminal; and a bootstrap circuit connected to the first and second control terminals and to the first and second voltage references and including: first and second bootstrap nodes; a first parasitic capacitance electrically coupled between said first control terminal and the first bootstrap node; and a second parasitic capacitance electrically coupled between said second control terminal and the second bootstrap node, the first and second parasitic capacitances having capacitance values of at least one order of magnitude lower than gate-source capacitances of said first and second switching transistors. In an embodiment, the transmission channel further comprises: an anti-noise block coupled between the clamp output and the connection terminal. In an embodiment, said first switching off transistor is a high voltage P-channel MOS transistor and said second switching off transistor is a high voltage N-channel MOS transistor. In an embodiment, the transmission channel further comprises a driving circuit coupled to control terminals of said first and second clamp transistors and of said first and second switching off transistors and configured to generate driving signals to close said first and second switching off transistors when said clamping circuit is active. In an embodiment, said driving circuit comprises: a first driving transistor coupled between the control terminal of the first clamping transistor and the control terminal of the second switching off transistor; and a second driving transistor coupled between the control terminal of the second clamping transistor and the control terminal of the first switching off transistor. In an embodiment, said bootstrap circuit comprises: a first biasing generator electrically coupled between said first control terminal of the first switching transistor and said first bootstrap node; and a second biasing generator electrically coupled between said second bootstrap node and said second control terminal of the second switching transistor, the first and second biasing generators including the first and second parasitic capacitances, respectively. In an embodiment, said bootstrap circuit further comprises: a first bootstrap transistor and a first bootstrap resistive element electrically coupled in series to each other between said first control terminal of the first switching transistor and said second bootstrap node; and a second bootstrap transistor and a second bootstrap resistive element electrically coupled in series to each other between said second control terminal of the second switching transistor and said first bootstrap node, said first bootstrap transistor has a control terminal electrically coupled to a source terminal of said first switching transistor and said second bootstrap transistor has a control terminal electrically coupled to a source terminal of said second switching transistor. In an embodiment, said values of said parasitic capacitances of said bootstrap circuit are of at least three orders of magnitude lower with respect to the gate-source capacitances of said first and second switching transistors.

In an embodiment, a transmission channel comprises: a voltage clamp including: a voltage clamp output; a first clamping transistor; and a second clamping transistor; a reset block including: a first memory diode coupled to a conduction terminal of the first clamp transistor and configured to couple to a conduction terminal of a first transistor of a high-voltage buffer; and a second memory diode coupled to a conduction terminal of the second clamp transistor and configured to couple to a conduction terminal of a second transistor of the high-voltage buffer; and a switching circuit, including: a connection terminal; an output terminal; first and second voltage reference terminals; first and second switching transistors electrically coupled in series to each other, and having respective body diodes coupled in anti-series, between said connection terminal and said output terminal, the first switching transistor having a first control terminal and the second switching transistor having a second control terminal; and a bootstrap circuit connected to the first and second control terminals and to the first and second voltage references and including: first and second bootstrap nodes; a first parasitic capacitance electrically coupled between said first control terminal and the first bootstrap node; and a second parasitic capacitance electrically coupled between said second control terminal and the second bootstrap node, the first and second parasitic capacitances having capacitance values of at least one order of magnitude lower than gate-source capacitances of said first and second switching transistors. In an embodiment, the transmission channel further comprises: the high-voltage buffer; and an anti-noise block coupled between the clamp and the switching circuit. In an embodiment, the transmission channel further comprises the high-voltage buffer, wherein the high voltage buffer includes at least one first branch having the first buffer transistor and a first buffer diode coupled in series between a first higher voltage reference terminal and a buffer central node, and a second buffer diode and the second buffer transistor coupled in series between said buffer central node and a first lower voltage reference terminal. In an embodiment, said first memory diode has a cathode coupled to said conduction terminal of the first buffer transistor and an anode coupled to said conduction terminal of the first clamp transistor, said second memory diode has an anode coupled to said conduction terminal of the second buffer transistor and a cathode coupled to said conduction terminal of the second clamp transistor, said first buffer diode has an anode coupled to the cathode of the first memory diode, said second buffer diode has a cathode coupled to the anode of the first memory diode, the conduction terminal of the first buffer transistor is a drain terminal of the first buffer transistor and the conduction terminal of the second buffer transistor is a drain terminal of the second buffer transistor. In an embodiment, said high voltage buffer block includes a second branch including a third buffer transistor and a third buffer diode coupled in series between a second higher voltage reference terminal and said buffer central node, and a fourth buffer diode and a fourth buffer transistor coupled in series between said buffer central node and a second lower voltage reference terminal, and said reset block comprises: a third memory diode coupled between a conduction terminal of the third buffer transistor and the conduction terminal of the first clamp transistor; and a fourth memory diode coupled between a conduction terminal of the fourth buffer transistor and the conduction terminal of the second clamp transistor, wherein said third memory diode has a cathode coupled to said conduction terminal of the third buffer transistor and an anode coupled to said conduction terminal of the first clamp transistor, said fourth memory diode has an anode coupled to the conduction terminal of said fourth buffer transistor and a cathode coupled to said conduction terminal of the second clamp transistor, the conduction terminal of the third buffer transistor is a drain terminal of the third buffer transistor and the conduction terminal of the fourth buffer transistor is a drain terminal of the fourth buffer transistor. In an embodiment, said bootstrap circuit comprises: a first biasing generator electrically coupled between said first control terminal of the first switching transistor and said first bootstrap node; and a second biasing generator electrically coupled between said second bootstrap node and said second control terminal of the second switching transistor, the first and second biasing generators including the first and second parasitic capacitances, respectively. In an embodiment, said bootstrap circuit further comprises: a first bootstrap transistor and a first bootstrap resistive element electrically coupled in series to each other between said first control terminal of the first switching transistor and said second bootstrap node; and a second bootstrap transistor and a second bootstrap resistive element electrically coupled in series to each other between said second control terminal of the second switching transistor and said first bootstrap node, said first bootstrap transistor has a control terminal electrically coupled to a source terminal of said first switching transistor and said second bootstrap transistor has a control terminal electrically coupled to a source terminal of said second switching transistor. In an embodiment, said values of said parasitic capacitances of said bootstrap circuit are of at least three orders of magnitude lower with respect to the gate-source capacitances of said first and second switching transistors. In an embodiment, the voltage clamp further comprises: a first clamping diode coupled between the first clamping transistor and the clamp output in anti-series with a body diode of the first clamping transistor; and a second clamping diode coupled between the second clamping transistor and the clamp output in anti-series with a body diode of the first clamping transistor.

In an embodiment, a system comprises: means for generating high-voltage pulses; means for clamping a transmission channel output to a reference voltage; means for biasing the means for clamping between pulses; and means for receiving pulse echos. In an embodiment, the means for clamping comprises: a clamp output; a clamp input configured to couple to a reference voltage; a first clamping transistor; a second clamping transistor; a first switching off transistor coupled between the output and the first clamping transistor; and a second switching off transistor of the clamp coupled between the output and the second clamping transistor, wherein, the first and second clamping transistors are high-voltage MOS transistors of complementary types; the first clamping transistor is coupled between the first switching off transistor and the input, the first clamping transistor and the first switching off transistor having body diodes coupled together in anti-series; and the second clamping transistor is coupled between the second switching off transistor and the input, the second clamping transistor and the second switching off transistor having body diodes coupled together in anti-series. In an embodiment, the means for biasing comprises: a first memory diode configured to couple to a conduction terminal of a first clamp transistor and to a conduction terminal of a first transistor of the means for generating high-voltage pulses; and a second memory diode configured to couple to a conduction terminal of a second clamp transistor and to a conduction terminal of a second transistor of the means for generating high-voltage pulses. In an embodiment, the means for receiving pulse echos comprises: a connection terminal; an output terminal; first and second voltage reference terminals; first and second switching transistors electrically coupled in series to each other, and having respective body diodes coupled in anti-series, between said connection terminal and said output terminal, the first switching transistor having a first control terminal and the second switching transistor having a second control terminal; and a bootstrap circuit connected to the first and second control terminals and to the first and second voltage references and including: first and second bootstrap nodes; a first parasitic capacitance electrically coupled between said first control terminal and the first bootstrap node; and a second parasitic capacitance electrically coupled between said second control terminal and the second bootstrap node, the first and second parasitic capacitances having capacitance values of at least one order of magnitude lower than gate-source capacitances of said first and second switching transistors.

Characteristics and the advantages of various embodiments of transmission channels will be apparent from the following description given by way of indicative and non limiting example with reference to the annexed drawings.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, high-voltage transistors, diodes, drivers, etc., are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 5:
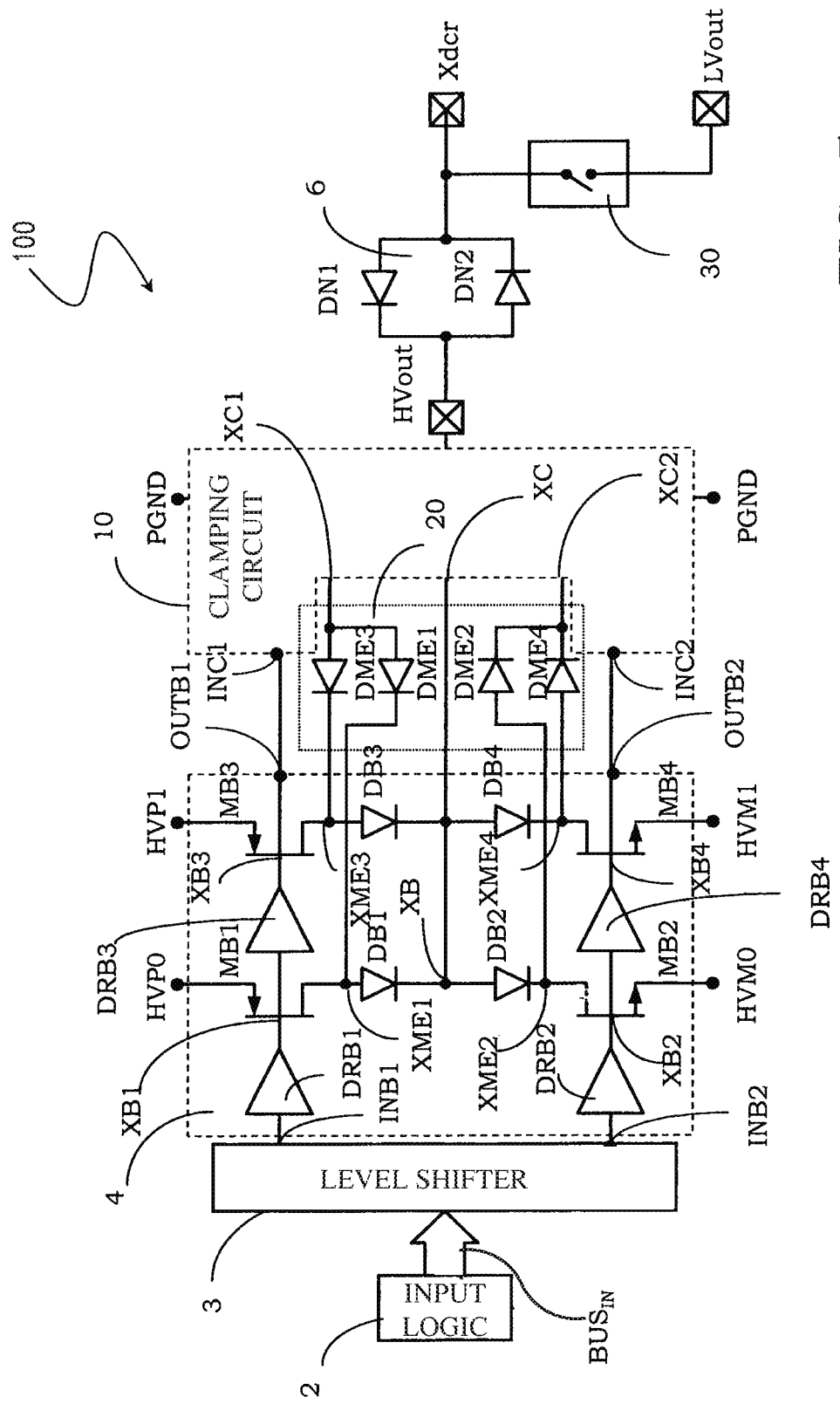
FIG. 5 schematically shows a transmission channel, for example for ultrasound applications, realised according to an embodiment.
Figure 6:
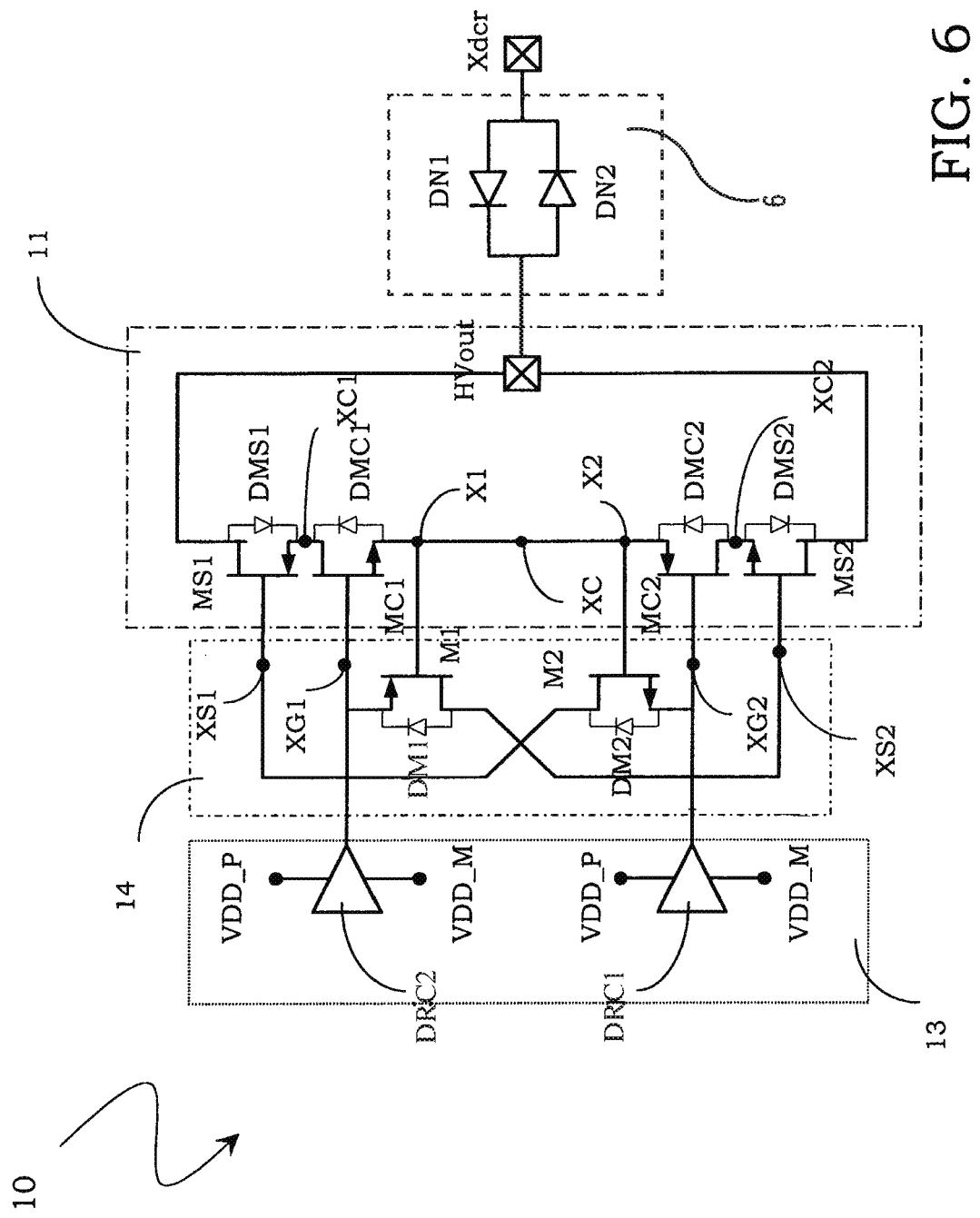
FIG. 6 schematically shows an embodiment of a clamping circuit comprised within the transmission channel of FIG. 5.

With reference to these figures, and in particular to FIGS. 5 and 6, a transmission channel for ultrasound applications is described, being globally indicated with 100.

In its more general form, the transmission channel 100 is of the type comprising at least one high voltage buffer block 4 in turn comprising buffer transistors and respective buffer diodes, being electrically coupled between respective voltage reference terminals. The buffer transistors are also connected to a clamping circuit 10, in turn comprising clamping transistors connected to internal nodes of the transmission channel 100 through diodes connected to prevent the body diodes of the clamping transistors from conducting. Moreover, the transmission channel 100 comprises at least one reset circuit 20 comprising diodes and being electrically coupled between circuit nodes of the high voltage buffer block 4 and of the clamping circuit 10, said circuit nodes being in correspondence with conduction terminals of the transistors comprised into the high voltage buffer block 4 and into the clamping circuit 10.

According to an embodiment, the transmission channel 100 comprises:

a clamping circuit 10 connected to a clamp voltage reference terminal PGND and comprising a clamping core 11 connected to a first output terminal HVout and having a clamp central node XC connected to a buffer central node XB of a high voltage buffer block 4;

a reset circuit 20, comprising diodes and coupled to the inner nodes of the high voltage buffer block 4 and of the clamping circuit 10 that are to be correctly repositioned or biased, as well as a switching circuit 30 electrically coupled between a connection terminal Xdcr to a load and a second output terminal LVout of the transmission channel 100.

More in detail, the reset circuit 20 is connected to the interconnection circuit nodes between the transistors and the buffer diodes of the high voltage buffer block 4 and to a first and to a second clamp circuit node, XC1 and XC2, of the clamping circuit 10. In particular, the reset circuit 20 is connected:

to a first memory node XME1, between the first buffer transistor MB1 and the first buffer diode DB1;
to a second memory node XME2, between the second buffer transistor MB2 and the second buffer diode DB2;
to a third memory node XME3, between the third buffer transistor MB3 and the third buffer diode DB3;
to a fourth memory node XME4, between the fourth buffer transistor MB4 and the fourth buffer diode DB4;
to the first clamp circuit node XC1; and
to the second clamp circuit node XC2.

As previously seen, the high voltage buffer block 4 comprises at least one first branch in turn including the first buffer transistor MB1 and the first buffer diode DB1, being electrically coupled, in series to each other, between a first higher voltage reference terminal HVP0 and the buffer central node XB and interconnected in correspondence with the first memory node XME1, as well as the second buffer diode DB2 and the second buffer transistor MB2, being electrically coupled, in series to each other, between the buffer central node XB and a first lower voltage reference terminal HVM0 and interconnected in correspondence with the second memory node XME2.

The high voltage buffer block 4 also has a first OUTB1 and a second output terminal OUTB2 respectively connected to a first INC1 and to a second input terminal INC2 of the clamping circuit 10.

The reset circuit 20 comprises respective memory nodes being electrically coupled between these circuit nodes and as illustrated at least:

one first memory diode DME1, being electrically coupled between the first memory node XME1 and the first clamp circuit node XC1; and
one second memory diode DME2, being electrically coupled between the second memory node XME2 and the second clamp circuit node XC2.

As illustrated, the first memory diode DME1 has a cathode terminal connected to the first memory node XME1 and an anode terminal connected to the first clamp circuit node XC1. In a dual way, the second memory diode DME2 has an anode terminal connected to the second memory node XME2 and a cathode terminal connected to the second clamp circuit node XC2.

Moreover, as previously seen, the high voltage buffer block 4 comprises, in parallel to the first branch, a second branch in turn including the third buffer transistor MB3 and the third buffer diode DB3, being electrically coupled, in series to each other, between a second higher voltage reference terminal HVP1 and the buffer central node XB and interconnected in correspondence with the third memory node XME3, as well as the fourth buffer diode DB4 and the fourth buffer transistor MB4, being electrically coupled, in series to each other, between the buffer central node XB and a second lower voltage reference terminal HVM1 and interconnected in correspondence with the fourth memory node XME4.

Further, the reset circuit 20 thus comprises:
- a third memory diode DME3, being electrically coupled between the third memory node XME3 and the first clamp circuit node XC1; and
- a fourth memory diode DME4, being electrically coupled between the fourth memory node XME4 and the second clamp circuit node XC2.

As illustrated, the third memory diode DME3 has a cathode terminal connected to the third memory node XME3 and an anode terminal connected to the first clamp circuit node XC1. In a dual way, the fourth memory diode DME4 has an anode terminal connected to the fourth memory node XME4 and a cathode terminal connected to the second clamp circuit node XC2.

The memory diodes DME1, DME2, DME3 and DME4 are high voltage diodes (HV diode).

In substance, the reset circuit 20 forces all the circuit nodes it is connected to in a neighbourhood of a value of ground reference and facilitates the transmission channel 100 restarting according to substantially a same condition at any pulse cycle.

It is to be noted that the memory circuit nodes correspond to the drain terminals of the corresponding buffer transistors of the high voltage buffer block 4. Moreover, the memory diodes are connected so as to have terminals being not homologue with the buffer diodes.

As illustrated, the first memory diode DME1 has the cathode terminal connected to the anode terminal of the first buffer diode DB1, the second memory diode DME2 has the anode terminal connected to the cathode terminal of the second buffer diode DB2, the third memory diode DME3 has the cathode terminal connected to the anode terminal of the third buffer diode DB3, and the fourth memory diode DME4 has the anode terminal connected to the cathode terminal of the fourth buffer diode DB4.

As previously seen, the high voltage buffer block 4 comprises respective buffer drivers connected to control terminals of the buffer transistors.

Furthermore, the transmission channel 100 comprises an anti-noise block 6 being electrically coupled between the first output terminal HVout and the connection terminal Xdcr.

As shown in greater detail in FIG. 6, the clamping circuit 10 comprises the clamping core 11, connected to the first output terminal HVout and in turn comprising a first and a second clamp transistor, MC1 and MC2, connected to the clamp central node XC and having respective control or gate terminals, XG1 and XG2.

These first and second clamp transistor, MC1 and MC2, have respective first and second equivalent diodes, DMC1 and DMC2, also indicated in the figure. In particular, in the example of the figure, the first clamp transistor MC1 is a high voltage N-channel MOS transistor (HV Nmos) while the second clamp transistor MC2 is a high voltage P-channel MOS transistor (HV Pmos).

The clamping core 11 also comprises a first and a second switching off transistor, MS1 and MS2. In particular, the first switching off transistor MS1 is electrically coupled in series to the first clamp transistor MC1 and connected to the first output terminal HVout. Moreover, the second switching off transistor MS2 is electrically coupled in series to the second clamp transistor MC2 and also connected to the first output terminal HVout.

These first and second switching off transistors, MS1 and MS2, have respective first and second equivalent diodes, DMS1 and DMS2, also indicated in the figure. In particular, the first and second switching off transistors, MS1 and MS2, are high voltage MOS transistors of the opposed type with respect to the clamp transistors, MC1 and MC2. In the example of the figure, the first switching off transistor MS1 is a high voltage P-channel MOS transistor (HV Pmos), while the second switching off transistor MS2 is a high voltage N-channel MOS transistor (HV Nmos). Moreover, the first equivalent or body diodes, DMS1 and DMC1, of the first switching off transistor MS1 and of the first clamping transistor MC1, respectively, are connected in anti-series in correspondence with a first clamp circuit node XC1. Analogously, the second equivalent or body diodes, DMS2 and DMC2, of the second switching off transistor MS2 and of the second clamping transistor MC2, respectively, are connected in anti-series in correspondence with a second clamp circuit node XC2.

These first and second switching off transistors, MS1 and MS2, are MOS transistors able to close themselves when the clamping circuit 10 is active and to sustain positive and negative high voltages when the clamping circuit 10 is not active and the transistors are in open configuration, in particular also thanks to the use of a suitable driving circuit, as it will be clarified hereafter.

Further, the clamping core 11 is then connected at the input to an input driver block 13 through a driving circuit 14 of the switching off transistors MS1 and MS2, suitable for closing the first and second switching off transistors, MS1 and MS2 when the clamping circuit 10 is active, as it will be clarified hereafter in the description.

The input driver block 13 is of the low voltage type and comprises a first driver DRC1 electrically coupled between a first clamp supply voltage reference terminal and a second clamp supply voltage reference terminal, higher VDD_P and lower VDD_M, respectively, and having an output terminal connected to the first control terminal XG1 of the first clamp transistor MC1 as well as a second driver DRC2, in turn electrically coupled between the first and second clamp supply voltage references, higher VDD_P and lower VDD_M, respectively, and having an output terminal connected to the second control terminal XG2 of the second clamp transistor MC2.

The driving circuit 14 comprises a first and a second driving transistor, M1 and M2, electrically coupled, in a crossed way, between the control terminals of the first and second clamp transistors, MC1 and MC2, and of the first and second switching off transistors, MS1 and MS2.

In particular, the first driving transistor M1 is electrically coupled between the first control terminal XG1 of the first clamp transistor MC1 and a control or gate terminal XS2 of the second driving transistor MS2, while the second driving transistor M2 is electrically coupled between a control or gate terminal XS1 of the first driving transistor MS1 and the control terminal XG2 of the second clamp transistor MC2.

Furthermore, the first and the second driving transistor, M1 and M2, have respective control or gate terminals, X1 and X2, connected to the clamp central node XC.

In particular, the first and second driving transistors, M1 and M2, are high voltage MOS transistors of a similar type with respect to the switching off transistors MS1 and MS2. In particular, in the example of the figure, the first driving transistor M1 is a high voltage P-channel MOS transistor (HV Pmos) while the second driving transistor M2 is a high voltage N-channel MOS transistor (HV Nmos). These first and second driving transistors, M1 and M2, have respective first and second equivalent diodes, DM1 and DM2, as indicated in the figure.

In this way, the driving circuit 14 ensures the switching off of the switching off transistors MS1 and MS2. In particular, the driving circuit 14 drives at high voltage the first and second switching off transistors, MS1 and MS2, forcing their closure during the clamping step, while the first and second clamp transistors, MC1 and MC2, are driven at low voltage (with voltage that varies between 0 and 3 V) directly by the input driver block 13.

The first output terminal HVout is thus forced to ground and kept to ground thanks to the switching off transistors MS1 and MS2 driven by the driving circuit 14, in particular at the turning-on and switching off of the first and of the second switching off transistors MS1 and MS2 by the first and second driving transistors M1 and M2.

Figure 1:
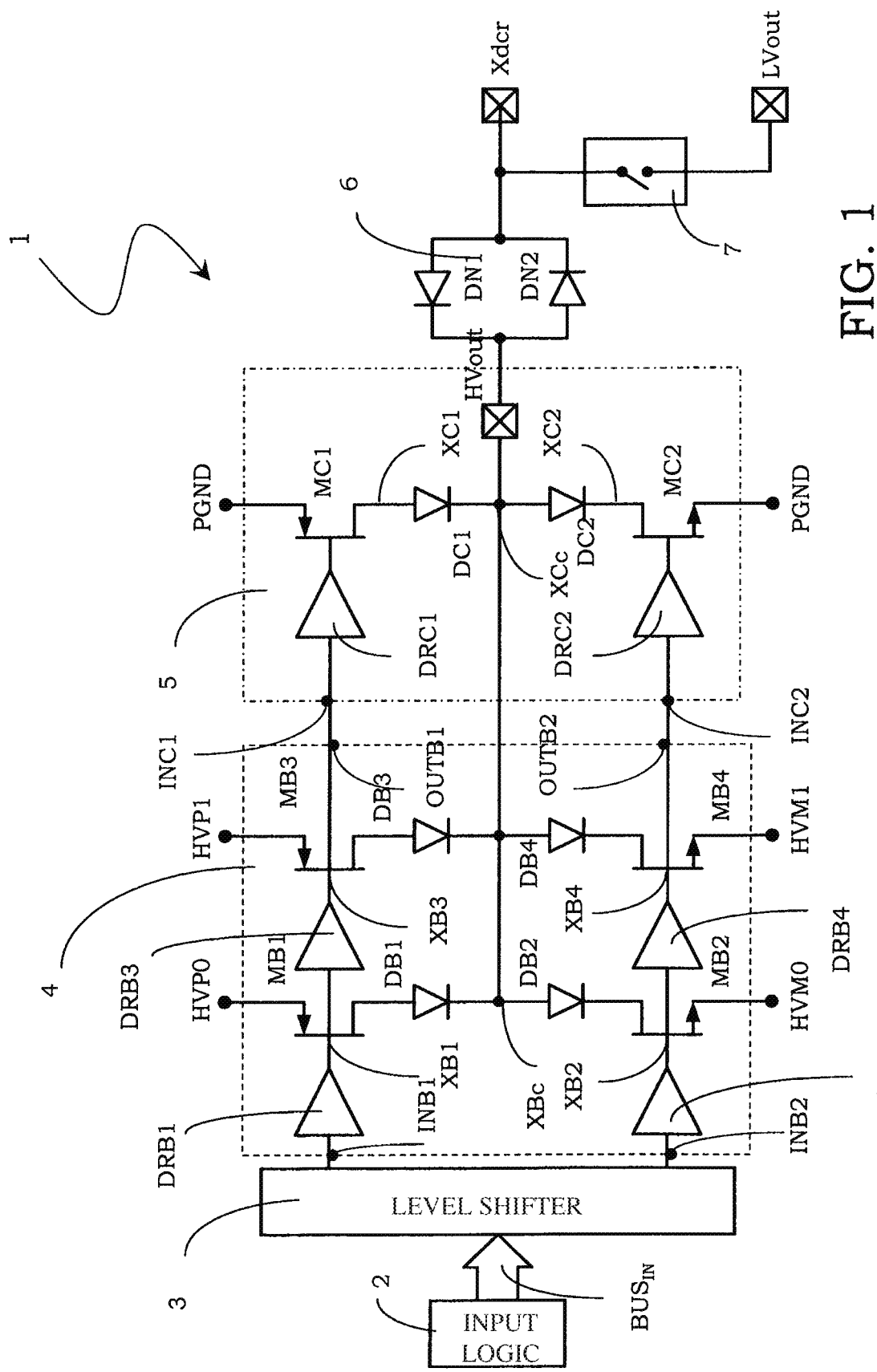
FIG. 1 schematically shows a transmission channel for ultrasound applications realised according to the prior art.
Figure 2:
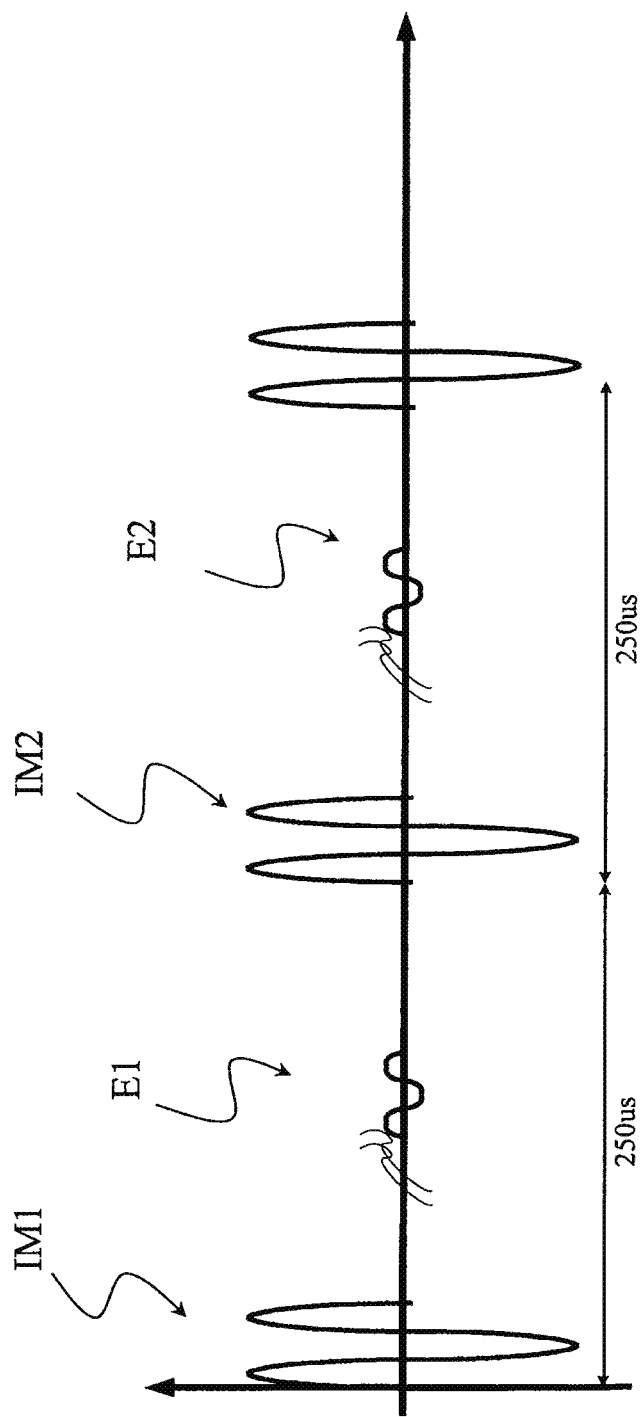
FIG. 2 schematically shows a first and a second ultrasound pulse used in an ultrasonic transducer.
Figures 3A, 3B:
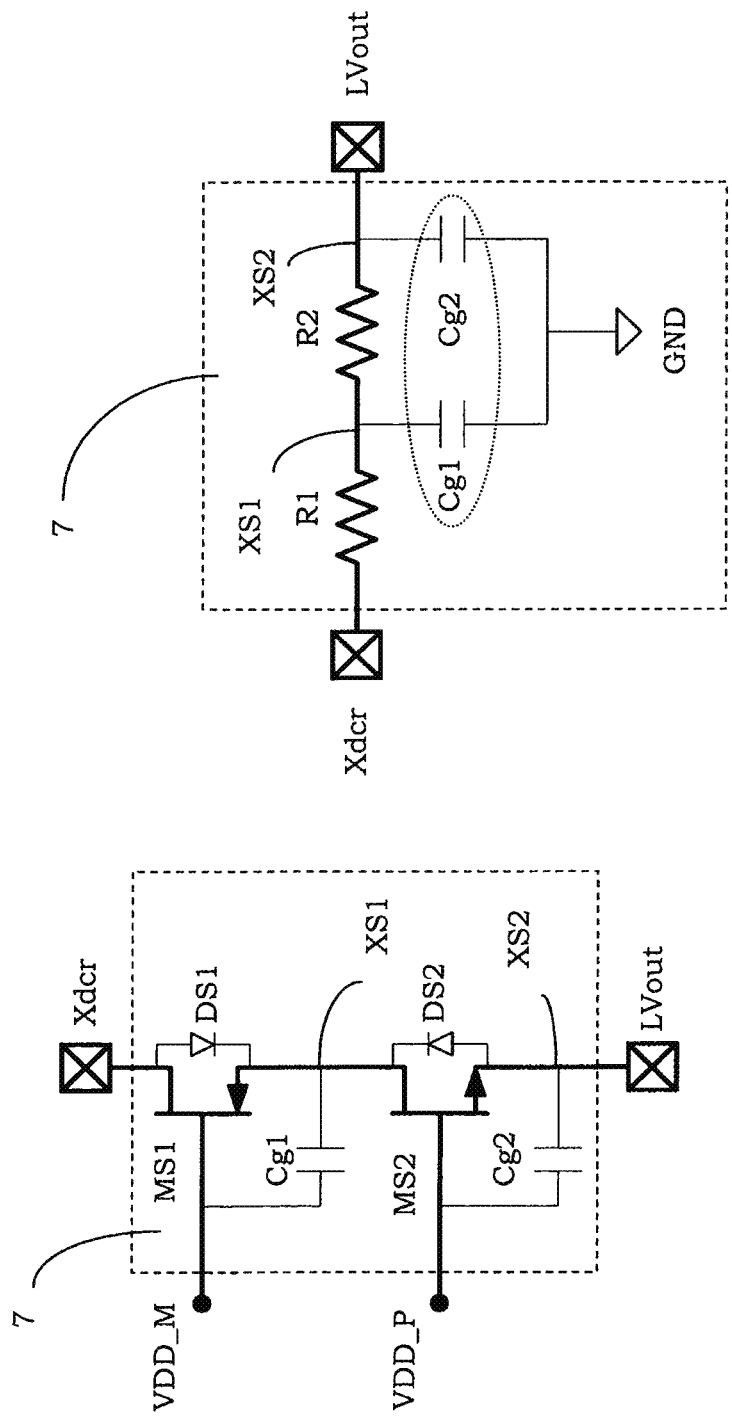
FIG. 3A shows in greater detail a high voltage switch during a turn-on step and being comprised within the transmission channel of FIG. 1.
FIG. 3B shows an equivalent circuit of the switch of FIG. 3A under turn-on conditions.
Figure 4:
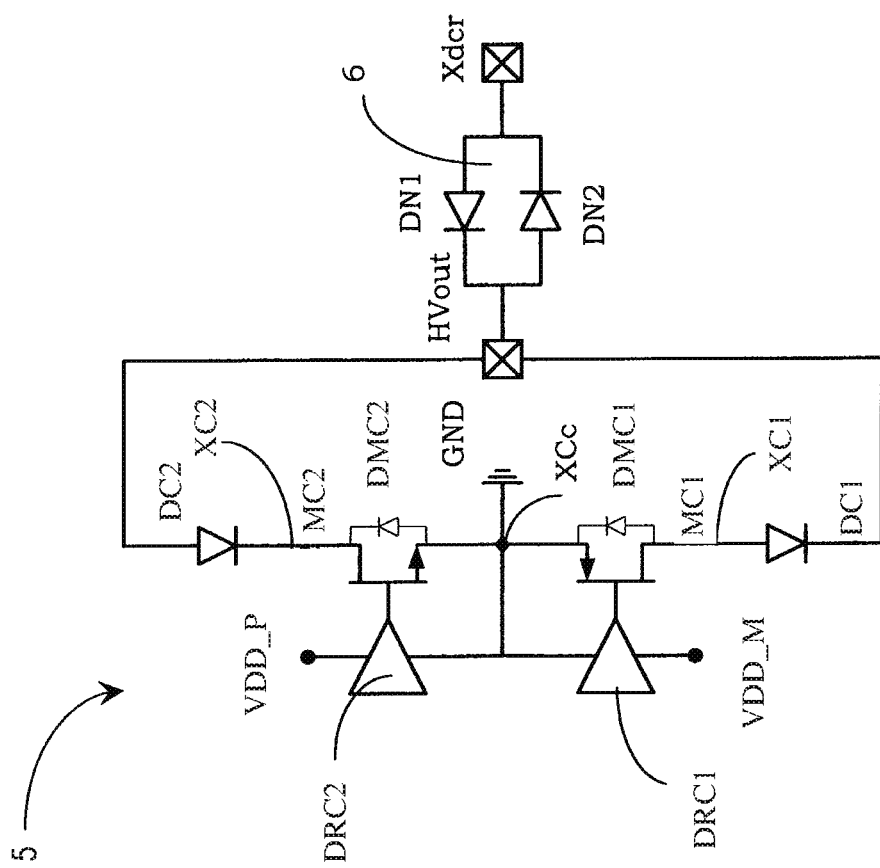
FIG. 4 shows in greater detail a block comprised within the transmission channel of FIG. 1.

It is to be noted that, during the clamping step, also with a high load value (and according to receiving conditions in case of application to a transmission channel), the current flows through the channel of the transistors of the clamping circuit 10 without charging the intrinsic diodes DMS1 and DMS2 of the switching off transistors MS1 and MS2, overcoming in this way the problems seen in relation to the prior art. In particular, the load current does not flow through the junction of the equivalent diodes DMS1 and DMS2 of the switching off transistors MS1 and MS2, but through their channel, avoiding to charge possible junction capacitances that would be present with the diodes of the circuit shown in FIG. 4.

The transmission channel 100 also comprises a switching circuit 30 in turn including at least one first switching transistor MSW1 and a second switching transistor MSW2 electrically coupled, in series to each other, between the connection terminal Xdcr and the second output terminal LVout. The switching circuit 30 is in particular used as switching circuit between a reception mode and a transmission mode of this transmission channel 100 and transfers, when on, a low voltage signal being at the output of the anti-noise block 6 of the transmission channel 100 towards the second output terminal LVout.

Figures 7A, 7B:
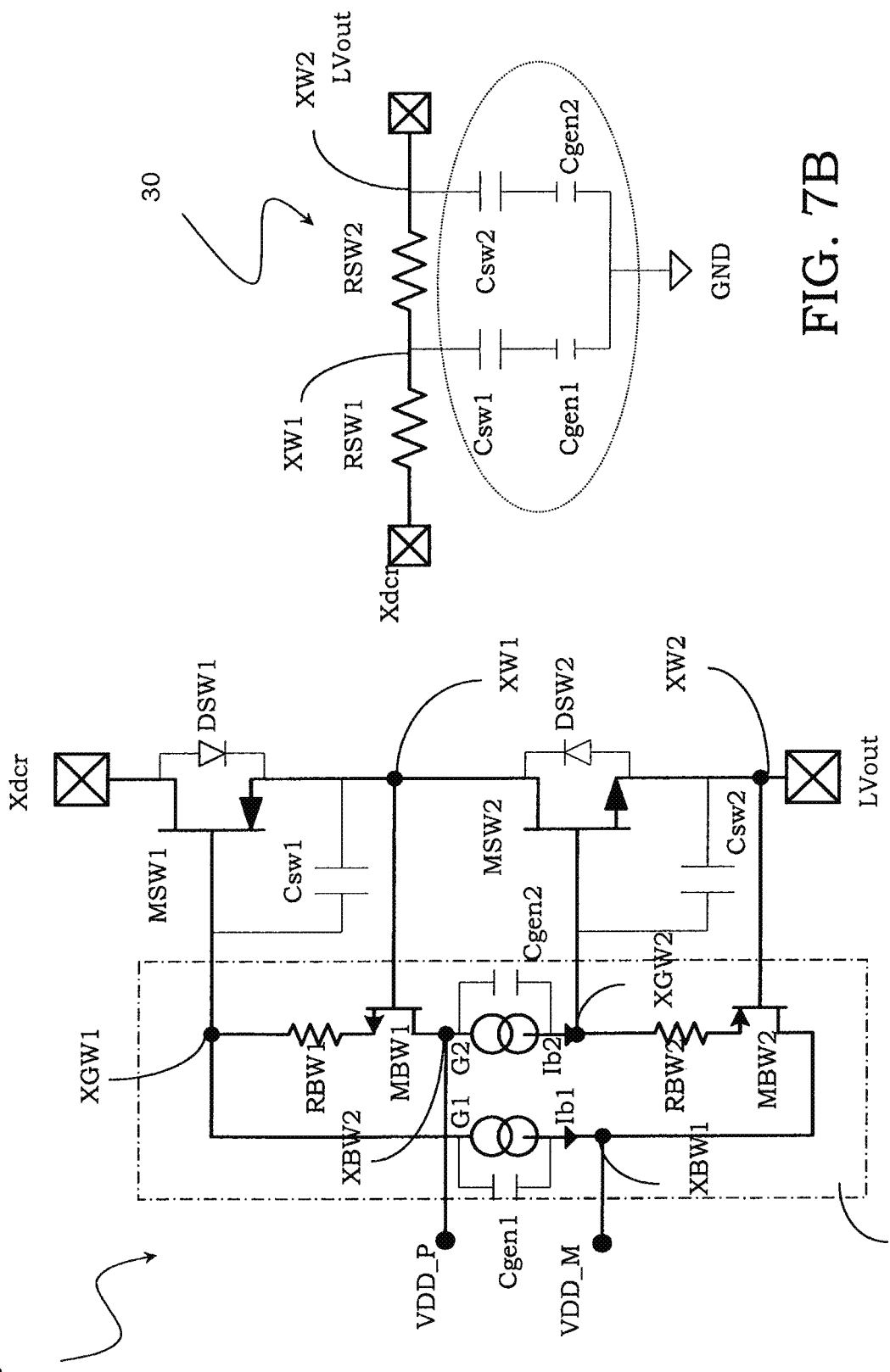
FIG. 7A shows in greater detail an embodiment of a switching circuit comprised within the transmission channel of FIG. 5.
FIG. 7B shows an equivalent circuit of the switching circuit of FIG. 7A according to turning-on conditions.

In the example of FIG. 7A, the first switching transistor MSW1 is a high voltage P-channel MOS transistor (HV Pmos) while the second switching transistor MSW2 is a high voltage N-channel MOS transistor (HV Nmos). In FIG. 7A also the parasite or body diodes of these transistors are indicated, respectively DSW1 and DSW2, being connected in antiseries in correspondence with a first inner circuit node XW1.

In an embodiment, the switching circuit 30 comprises at least one bootstrap circuit 31 connected to a first control or gate terminal XGW1 and to a second control or gate terminal XGW2 of the first switching transistor MSW1 and of the second switching transistor MSW2, respectively.

The bootstrap circuit 31 is also connected, in correspondence with a first bootstrap node XBW1 and with a second bootstrap node XBW2, to a first voltage reference terminal VDD_M and to a second voltage reference terminal VDD_P, in particular a supply one.

The bootstrap circuit 31 comprises at least one first biasing generator G1 being electrically coupled between the first control terminal XGW1 and the first bootstrap node XBW1, as well as a second biasing generator G2 electrically coupled between the second bootstrap node XBW2 and the second control terminal XGW2. These first and second biasing generators, G1 and G2, supply respective first and second biasing currents, Ib1 and Ib2 and have respective first and second parasite capacitances, Cgen1 and Cgen2, that are the parasite capacitances of the bootstrap circuit 31, respectively electrically coupled between the first control terminal XGW1 and the first bootstrap node XBW1 and between the second control terminal XGW2 and the second bootstrap node XBW2.

These first and second parasite capacitances, Cgen1 and Cgen2, may have much lower capacitance than respective first and second gate-source capacitances, Csw1 and Csw2, of the first and second switching transistor, MSW1 and MSW2. For example, these first and second parasite capacitances, Cgen1 and Cgen2, have a capacitive value of at least one order of magnitude, preferably in some embodiments of some orders of magnitude, for example three orders of magnitude, lower than the first and second gate-source capacitances, Csw1 and Csw2.

For example, the first parasite capacitance Cgen1 has capacitive value of at least one order of magnitude lower than the first gate-source capacitance Csw1 of the first switching transistor MSW1 and the second parasite capacitance Cgen2 has capacitive value of at least one order of magnitude lower that the second gate-source capacitance Csw2 of the second switching transistor MSW2.

The bootstrap circuit 31 also comprises a first bootstrap transistor MBW1 being electrically coupled, in series to a first bootstrap resistive element RBW1, between the first control terminal XGW1 of the first switching transistor MSW1 and the second bootstrap node XBW2. The first bootstrap transistor MBW1 also has a control or gate terminal connected to the first inner circuit node XW1 of the switching circuit 30, corresponding to a source terminal of the first switching transistor MSW1.

Similarly, the bootstrap circuit 31 comprises a second bootstrap transistor MBW2 being electrically coupled, in series to a second bootstrap resistive element RBW2, between the second control terminal XGW2 of the second switching transistor MSW2 and the first bootstrap node XBW1. The second bootstrap transistor MBW2 also has a control or gate terminal connected to a second inner circuit node XW2 of the switching circuit 30, corresponding to a source terminal of the second switching transistor MSW2.

In the example of the figure, the first bootstrap transistor MBW1 is a low voltage N-channel MOS transistor (LV Nmos) while the second bootstrap transistor MBW2 is a low voltage P-channel MOS transistor (LV Pmos).

The first biasing generator G1 is a current generator suitable for supplying such a current Ib1 that the voltage developed by this current Ib1 flowing through the first bootstrap transistor MBW1 and the first bootstrap resistive element RBW1 is able to turn on the first switching transistor MSW1. The same way, the second biasing generator G2 is a current generator suitable for supplying such a current Ib2 that the voltage developed by this current Ib2 flowing through the second bootstrap transistor MBW2 and the second bootstrap resistive element RBW2 is able to turn on the second switching transistor MSW2.

According to working or turn-on conditions of the switching circuit 30, the same behaves like its equivalent circuit shown in FIG. 7B.

For example, the gate terminals of the switching transistors MSW1 and MSW2 are both connected to a node in voltage, schematised in the Figure as connected to the ground GND and these transistors behave as respective resistances RSW1 and RSW2, that are electrically coupled between the connection terminal Xdcr and the output terminal LVout of the transmission channel 1 (the output terminal LVout coinciding with the second inner circuit node XW2) and interconnected in correspondence with the first inner circuit node XW1.

According to these conditions, thanks to the presence of the bootstrap circuit 31 and of its biasing generators G1 and G2, the first gate-source capacitance Csw1 of the first switching transistor MSW1 is electrically coupled, in series to the first parasite capacitance Cgen1 of the first biasing generator G1 between the first inner circuit node XW1 and ground GND, while the second gate-source capacitance Csw2 of the second switching transistor MSW2 is electrically coupled, in series to the second parasite capacitance Cgen2 of the second biasing generator G2 between the second inner circuit node XW2 and ground GND.

In this way, the total parasite capacitance (enclosed by a dotted circle in FIG. 7B) is reduced with respect to the known circuits, decreasing in consequence the undesired mitigation of the signal at the input of the switching circuit 30 itself, in particular applied to the connection terminal Xdcr and transmitted towards the second output terminal LVout.

According to an embodiment, the transmission channel 100 is for example used for the driving of a piezoelectric transducer for ultrasound applications.

In an embodiment, the transmission channel 100, thanks to the presence of the clamping circuit as above indicated facilitates more accurate clamping of the same to a voltage reference, for example to a ground GND, also when a load of high value is present, eliminating or reducing malfunctions connected to the load of the junction capacitances of the diodes of the known circuits.

For example, when the clamping circuit is turned on, the value of the voltage being on the connection terminal Xdcr reaches a value equal to the ground value GND plus or minus a diode voltage, improving the performances of second harmonic especially at low supply voltages.

Furthermore, a leakage current during a receiving step of the transmission channel according an embodiment of the clamping circuit is conveyed towards the ground reference terminal GND preventing the first output terminal HVout from charging itself and overcoming in this way the drawbacks of the circuits described in relation to the prior art.

Moreover, the reset circuit, after a clamping step realised by the clamping circuit, forces the voltage value of drain terminal of the buffer transistors, which are high power MOS transistors, comprised within the high voltage buffer block to voltage values next to a ground reference value, so that successive pulse cycles applied to the transmission channel restart from substantially a same initial condition.

For example, in case of ultrasound applications, this limits the differences between ultrasound pulse and successive ultrasound pulse.

In an embodiment of the switching circuit, transmission of a signal applied to the connection terminal Xdcr of the transmission channel is facilitated, this switching circuit having a reduced total parasite capacitance when in turn-on conditions.

A technician of the field, with the aim of meeting incidental and specific needs, will be allowed to introduce several modifications and variations to the above described circuit, all within the scope of protection of the disclosure.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The various embodiments described above can be combined to provide further embodiments. U.S. patent application Ser. Nos. 13/538,598, 13/538,802 and 13/538,840 are incorporated herein by reference in their entireties (each of which claims priority to Italian Application Nos. MI09A002338, MI09A002339, MI09A002340 and MI09A002341, all filed on Dec. 30, 2009, and to International Application Nos. PCT/EP2010/005927, PCT/EP2010/005930, PCT/EP2010/005931 and PCT/EP2010/005932, all filed on Sep. 29, 2010).

Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
a connection terminal configured to couple to a transducer;
a high-voltage output terminal;
a low-voltage output terminal;
a high-voltage buffer configured to output high-voltage pulses;
a voltage clamp coupled to an output of the high-voltage buffer and to the high-voltage output terminal and configured to clamp the high-voltage output terminal to a reference voltage between high-voltage pulses;
a bias circuit coupled between the high-voltage buffer and the voltage clamp and configured to bias the voltage clamp between high-voltage pulses; and
a high-voltage switch configured to couple the connection terminal to the low-voltage output terminal between high-voltage pulses.

2. The system of claim 1 wherein the voltage clamp comprises:
a first clamping transistor;
a second clamping transistor;
a first switching off transistor coupled between the high-voltage output terminal and the first clamping transistor; and
a second switching off transistor of the clamp coupled between the high-voltage output terminal and the second clamping transistor, wherein,
the first and second clamping transistors are high-voltage MOS transistors of complementary types;
the first clamping transistor and the first switching off transistor have body diodes coupled together in anti-series; and the second clamping transistor and the second switching off transistor have body diodes coupled together in anti-series.

3. The system of claim 2 wherein the bias circuit comprises:
a first memory diode configured to couple to a conduction terminal of the first clamping transistor and to a conduction terminal of a first transistor of the high-voltage buffer; and
a second memory diode configured to couple to a conduction terminal of the second clamping transistor of the voltage clamp and to a conduction terminal of a second transistor of the high-voltage buffer.

4. The system of claim 1 wherein the bias circuit comprises:
a first memory diode configured to couple to a conduction terminal of a first clamp transistor of the voltage clamp and to a conduction terminal of a first transistor of the high-voltage buffer; and
a second memory diode configured to couple to a conduction terminal of a second clamp transistor of the voltage clamp and to a conduction terminal of a second transistor of the high-voltage buffer.

5. The system of claim 1 wherein the high-voltage switch comprises:
first and second voltage reference terminals;
first and second switching transistors electrically coupled in series to each other, and having respective body diodes coupled in anti-series, between said connection terminal and said low-voltage output terminal, the first switching transistor having a first control terminal and the second switching transistor having a second control terminal; and
a bootstrap circuit connected to the first and second control terminals and to the first and second voltage references and including:
first and second bootstrap nodes;
a first parasitic capacitance electrically coupled between said first control terminal and the first bootstrap node; and
a second parasitic capacitance electrically coupled between said second control terminal and the second bootstrap node, the first and second parasitic capacitances having capacitance values of at least one order of magnitude lower than gate-source capacitances of said first and second switching transistors.

6. The system of claim 1, comprising:
an anti-noise block coupled between the voltage clamp and the switching circuit.

7. The system of claim 2, comprising a driving circuit coupled to control terminals of said first and second clamping transistors and of said first and second switching off transistors and configured to generate driving signals to close said first and second switching off transistors when said clamping circuit is active.

8. The system of claim 7 wherein said driving circuit comprises:
a first driving transistor coupled between the control terminal of the first clamping transistor and the control terminal of the second switching off transistor; and
a second driving transistor coupled between the control terminal of the second clamping transistor and the control terminal of the first switching off transistor.

9. The system of claim 8 wherein said first and second driving transistors have respective control terminals coupled to a conduction terminal of the first clamping circuit and a conduction terminal of the second clamping circuit.

10. The system according to claim 2 wherein said first clamping transistor is a high voltage N-channel MOS transistor and said second clamping transistor is a high voltage P-channel MOS transistor.

11. The system of claim 1 wherein the high voltage buffer includes at least one first branch having a first buffer transistor and a first buffer diode coupled in series between a first higher voltage reference terminal and a buffer central node, and a second buffer diode and a second buffer transistor coupled in series between said buffer central node and a first lower voltage reference terminal.

12. The system of claim 1, further comprising an ultrasound transducer coupled to the connection terminal.

13. The system of claim 12 wherein the ultrasound transducer comprises a piezoelectric transducer.

14. A method, comprising:
transmitting a series of high-voltage pulses through a transmission channel to a connection terminal;
clamping, using a voltage clamp, a high-voltage output terminal of the transmission channel to a reference voltage between high-voltage pulses;
biasing the high-voltage clamp between high-voltage pulses; and
coupling the connection terminal to a low-voltage output terminal between high-voltage pulses.

15. The method of claim 14, comprising:
driving a piezoelectric transducer coupled to the connection terminal with the high-voltage pulses.

16. The method of claim 15, comprising:
receiving pulse echos from the piezoelectric transducer between high-voltage pulses.

17. The method of claim 14, comprising:
driving an transducer with the high-voltage pulses;
receiving pulse echos at the low-voltage output terminal between pulses; and
producing an image based on the received pulse echos.

18. The method of claim 17 wherein the transducer is an ultrasound transducer.

* * * * *